United States Patent
Lo Hine Tong et al.

(10) Patent No.: US 9,660,350 B2
(45) Date of Patent: May 23, 2017

(54) METHOD FOR CREATING A SLOT-LINE ON A MULTILAYER SUBSTRATE AND MULTILAYER PRINTED CIRCUIT COMPRISING AT LEAST ONE SLOT-LINE REALIZED ACCORDING TO SAID METHOD AND USED AS AN ISOLATING SLOT OR ANTENNA

(71) Applicant: THOMSON LICENSING, Issy de Moulineaux (FR)

(72) Inventors: Dominique Lo Hine Tong, Rennes (FR); Philippe Minard, Saint Medarde sur Ille (FR); Jean-Luc Robert, Betton (FR)

(73) Assignee: THOMSON LICENSING, Issy-les-Moulineaux (FR)

( * ) Notice: Subject to any disclaimer, the term of this patent is extended or adjusted under 35 U.S.C. 154(b) by 117 days.

(21) Appl. No.: 14/400,382

(22) PCT Filed: May 6, 2013

(86) PCT No.: PCT/EP2013/059394
§ 371 (c)(1),
(2) Date: Nov. 11, 2014

(87) PCT Pub. No.: WO2013/171087
PCT Pub. Date: Nov. 21, 2013

(65) Prior Publication Data
US 2015/0123861 A1    May 7, 2015

(30) Foreign Application Priority Data

May 14, 2012 (FR) ...................... 12 54368

(51) Int. Cl.
*H01Q 13/10* (2006.01)
*H05K 1/02* (2006.01)
(Continued)

(52) U.S. Cl.
CPC ........... *H01Q 13/106* (2013.01); *H01P 3/023* (2013.01); *H01Q 1/38* (2013.01); *H01Q 9/42* (2013.01);
(Continued)

(58) Field of Classification Search
CPC ........... H01Q 1/52; H01Q 1/521; H01Q 1/525
See application file for complete search history.

(56) References Cited

U.S. PATENT DOCUMENTS

| 6,188,368 B1 | 2/2001 | Koriyama et al. |
| 6,985,108 B2 | 1/2006 | Mikkola et al. |

(Continued)

FOREIGN PATENT DOCUMENTS

| CN | 101106215 | 1/2008 |
| CN | 101820101 | 9/2010 |

(Continued)

OTHER PUBLICATIONS

Svacina et al: Dispersion Characteristics of Multilayered Slotlines—A Simple Approach, IEEE Transactions on Microwave Theory. vol. 47, No. 9, Sep. 1999, pp. 1826-1829.
(Continued)

*Primary Examiner* — Robert Karacsony
(74) *Attorney, Agent, or Firm* — Brian J. Dorini; Patricia A. Verlangieri (57) ABSTRACT

The present invention relates to a method for realizing a short-circuited slot-line on a multilayer substrate comprising at least a first conductive layer, a dielectric layer and a second conductive layer, the method comprising the following steps:
etching in the first conductive layer a slot-line having an electrical length L,
etching in the first conductive layer, around the slot-line, a first portion of a first band having an electrical length L1≤L,
(Continued)

etching in the first conductive layer, around the slot-line, a second portion of said first band, having an electrical length L2≤L, etching in the second conductive layer, a second band in the form of a loop having an electrical length L3, one end of the second band being connected to the first part of the first band and the other end of the second band being connected to the second part of the first band so as to form a conductive loop.

The method is used notably to realize isolating slot-lines and slot-antennae.

16 Claims, 6 Drawing Sheets

(51) Int. Cl.

| | | |
|---|---|---|
| *H05K 3/22* | (2006.01) |
| *H01Q 1/38* | (2006.01) |
| *H01P 3/02* | (2006.01) |
| *H01Q 9/42* | (2006.01) |
| *H01Q 1/52* | (2006.01) |
| *H01Q 21/28* | (2006.01) |

(52) U.S. Cl.
CPC ............. *H05K 1/0298* (2013.01); *H05K 3/22* (2013.01); *H01Q 1/521* (2013.01); *H01Q 21/28* (2013.01)

(56) References Cited

U.S. PATENT DOCUMENTS

| | | |
|---|---|---|
| 7,872,605 B2 | 1/2011 | Baliarda et al. |
| 2003/0193437 A1 | 10/2003 | Kangasvieri et al. |
| 2007/0222699 A1 | 9/2007 | Modro |
| 2009/0174617 A1 | 7/2009 | Chen |
| 2010/0220030 A1 | 9/2010 | Shimoda et al. |
| 2013/0187823 A1 | 7/2013 | Lo Hine Tong et al. |

FOREIGN PATENT DOCUMENTS

| | | |
|---|---|---|
| EP | 2230717 | 9/2010 |
| WO | WO2006097496 | 9/2006 |

OTHER PUBLICATIONS

Search Report Dated Jun. 5, 2013.

METHOD FOR CREATING A SLOT-LINE ON A MULTILAYER SUBSTRATE AND MULTILAYER PRINTED CIRCUIT COMPRISING AT LEAST ONE SLOT-LINE REALIZED ACCORDING TO SAID METHOD AND USED AS AN ISOLATING SLOT OR ANTENNA

This application claims the benefit, under 35 U.S.C. §365 of International Application PCT/EP2013/059394, filed May 6, 2013, which was published in accordance with PCT Article 21(2) on Nov. 21, 2013 in English and which claims the benefit of French patent application No. 1254368, filed on May 14, 2012.

TECHNICAL FIELD

The present invention relates generally to printed circuit boards used in wireless systems. It relates more specifically to a method for realizing a slot-line on a multilayer substrate as well as a multilayer printed circuit comprising at least one slot-line realized according to said method, this slot-line being able to be used notably as an isolating slot or a slot-antenna.

TECHNOLOGICAL BACKGROUND

In the field of wireless communications, MIMO (Multiple Input Multiple Output) circuits are increasingly used in order to increase the capacity of the transmission channels and to improve the operation of the entire system. The use of MIMO circuits generally leads to an increase in the number of antennae to be realized for the same board. On the other hand, in order to facilitate the integration of the circuits, the antennae are now printed directly onto the PCB (printed circuit board). However, by application of the laws of physics, the length of the antennae and the length of the isolation elements depend on the wavelength. Thus, when a short-circuited slot is used to reduce the mutual coupling between two PIFA type antennae, the wavelength of the slot which must be substantially equal to $\lambda g/4$ where $\lambda g$ is the guided wavelength at the operating frequency, gives a physical length of around 23 mm for WiFi operation in the 2.4 GHz frequency band. This length is not negligible with respect to the cost and size constraints on the printed circuit boards used in mass production. However, printed circuit boards are most often formed by substrates having a multilayer structure.

SUMMARY OF THE INVENTION

The present invention therefore proposes to use the multilayer structure of printed circuit boards to realize short-circuited slot-lines which can be used either as isolation lines or slot-antennae while limiting the size of the printed circuit board.

Thus the present invention relates to a method for realizing a short-circuited slot-line in a multilayer substrate of a printed circuit comprising at least a first conductive layer, a dielectric layer and a second conductive layer, the method comprising the following steps:
- etching in the first conductive layer a slot-line having an electrical line L,
- etching in the first conductive layer, along a first side of the slot-line, a first portion of a first conductive band having an electrical length $L1 \le L$,
- etching in the first conductive layer, along a second side of the slot-line, a second portion of said first conductive band, having an electrical length $L2 \le L$,
- etching in the second conductive layer, a second conductive band in the form of a loop having an electrical length L3,
- one end of the second conductive band being connected to the first portion of the first conductive band and the other end of the second conductive band being connected to the second portion of the first conductive band so as to form a conductive loop.

According to another characteristic of the present invention, the electrical lengths L1 and L2 of the first and of the second portion of the first conductive band are identical.

According to another characteristic of the present invention, the electrical length L3 is substantially equal to the sum of the electrical lengths L1 and L2.

According to a particular embodiment, the slot-line is a line of electrical length L<90°, preferably the electrical length of slot-line L=45°.

According to another embodiment, electrical lengths L1 and L2 of the first and second portions of the first conductive band are equal to 45°.

Preferably, the total electrical length of the first and second conductive bands is substantially equal to 180°.

The present invention also relates to a multilayer printed circuit characterized in that it comprises at least one slot-line realized as described above.

According to one embodiment, the slot-line is an isolating slot.

According to another embodiment, the slot-line is a slot-antenna. In this case, in order to improve the operation of the slot-antenna, the slots determining the first and second portions of the first band extend by an open circuited slot.

The present invention also concerns a terminal incorporating at least a printed circuit as described above.

BRIEF DESCRIPTION OF THE DRAWINGS

Other characteristics and advantages of the present invention will appear upon reading the description of different embodiments, this description being realized with reference to the enclosed drawings, wherein.

DETAILED DESCRIPTION OF DIFFERENT EMBODIMENTS

A description will first be given with reference to FIGS. 1 to 5, of the realization of an isolating slot on a multilayer printed circuit board in accordance with the method of the present invention.

In this case, the printed circuit is realized by using a substrate known as FR4 which has a thickness of 1 mm.

Figure 1A:
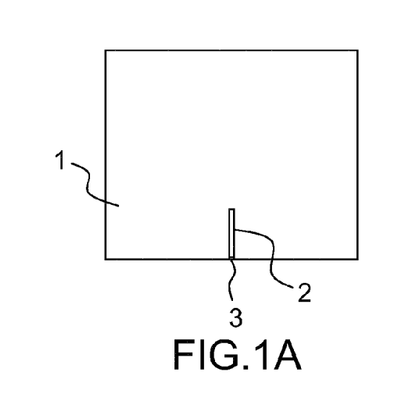
FIGS. 1A and 1B show respectively the first step for realizing an isolating slot according to the realization method of the present invention as well as a curve giving the returned reflection phase at the input as a function of the frequency of said slot.

As shown in FIG. 1A, at the edge of substrate 1 a short-circuited slot-line 2 was etched comprising an excitation point 3.

According to the present invention, slot-line 2 has an electrical length less than 90°, preferably an electrical length chosen to be equal to 45°. In this particular embodiment, the length of the slot-line is divided in two by folding the slot upon itself, as explained in more detail hereafter. However, other electrical lengths can be chosen depending on the results to be achieved or on the constraints for realizing the board.

A slot-line such as shown in FIG. 1A was simulated by using a HFSS 3D EM simulator. For the simulation, and as mentioned above, the substrate is a FR4 substrate and slot-line 2 has a width of 1 mm and a length of 10 mm.

Figures 1B, 2B:
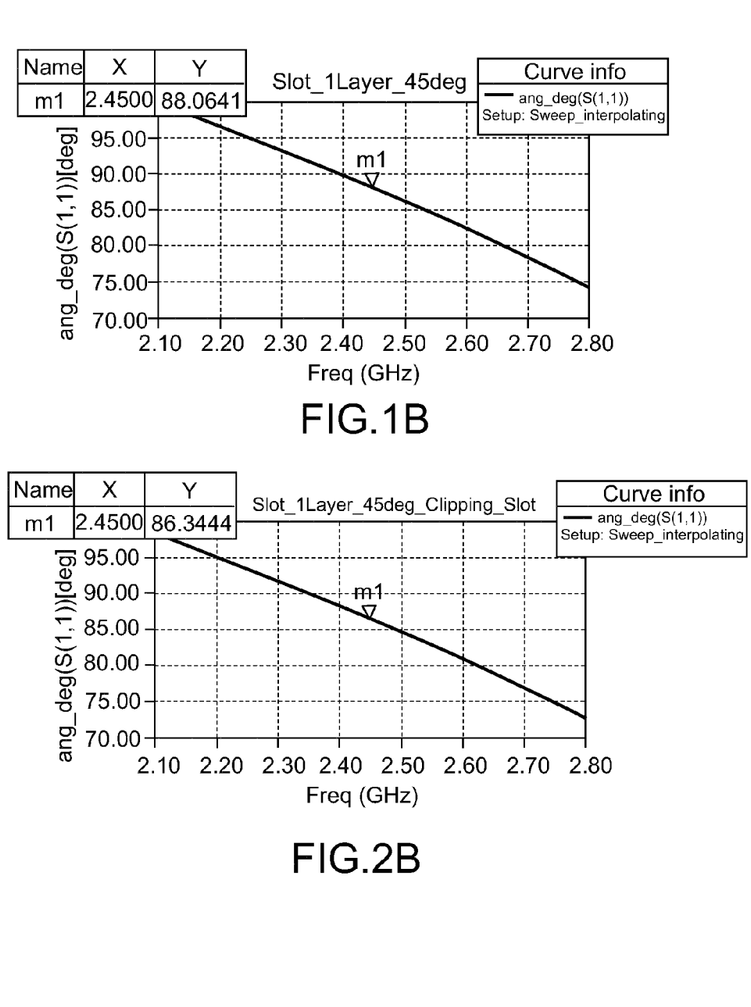
FIG. 2A shows the second step for realizing an isolating slot according to the method of the present invention and FIG. 2B shows a curve giving the returned reflection phase at the input as a function of the frequency of the isolating slot of FIG. 2A.

With the parameters mentioned above, a curve was obtained giving the returned reflected phase (in degrees) at the input 3 as a function of the frequency, as shown in FIG. 1B. It can be seen that, in this case, for a slot of electrical length of around 45°, the obtained phase is close to 90° at a frequency of 2.45 GHz, as represented by point m1.

Figure 2A:
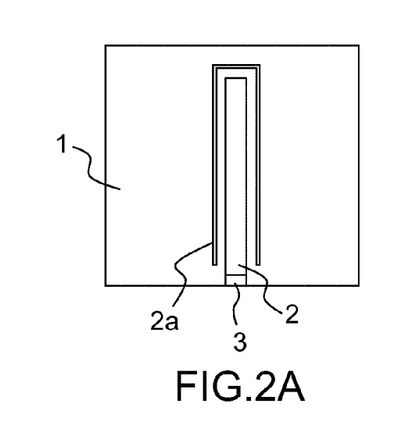

In a second step more specifically shown in FIG. 2A, to realize the first and second portions of the first conductive band around the slot-line, a thin slot 4 surrounding slot-line 2 is etched around slot-line 2. This slot 4 has a width of 0.15 mm and is located at a distance of 0.5 mm from the edges of slot-line 2, in the simulated embodiment. It is etched in the conductive layer or in the upper ground plane of substrate 1. In this case, and as shown in FIG. 2B, the value of the phase for point m1 on the curve is similar to that shown in FIG. 1B, which signifies that slot 4 etched around slot-line 2 does not modify the behavior of the main slot.

Figure 3A:
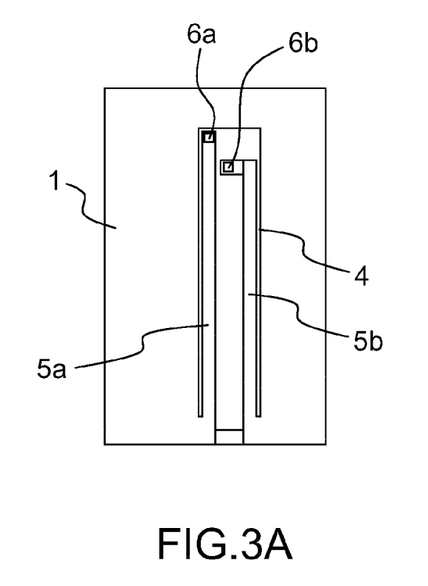
FIGS. 3A and 3B show respectively a top view of the isolating slot and of the first conductive band and a top view of the isolating slot realized according to the method of the present invention.

In a next step, the short-circuited part 2a, shown in FIG. 2A, is open so as to realize two conductive portions 5a and 5b forming respectively the first portion of a first conductive band having an electrical length L1 and the second portion of a first conductive band having an electrical length L2, as shown in FIG. 3A.

Figure 3B:
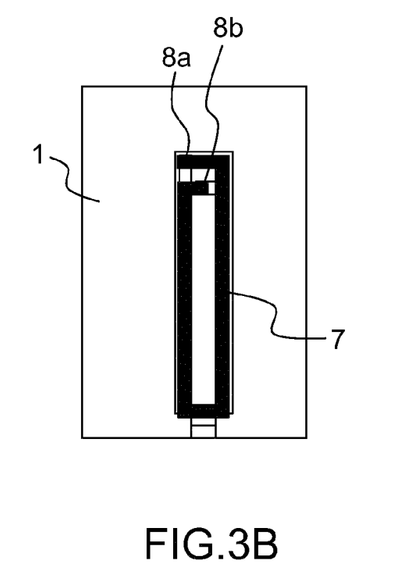

In a subsequent step and as shown in FIG. 3B, in the second conductive layer opposite the conductive layer 1 of the printed circuit there is realized a second conductive band 7 in the form of a loop. The two ends 8a and 8b of the conductive layer 7 are connected by metalized holes or similar to the two ends 6a and 6b of the first and second portions 5a and 5b of the first band realized on the first conductive layer.

A complete perspective view of an isolating slot-line realized according to the method described above is shown in FIG. 4 in which the same references represent the same elements as the elements described with reference to FIGS. 3A and 3B.

Figure 4:
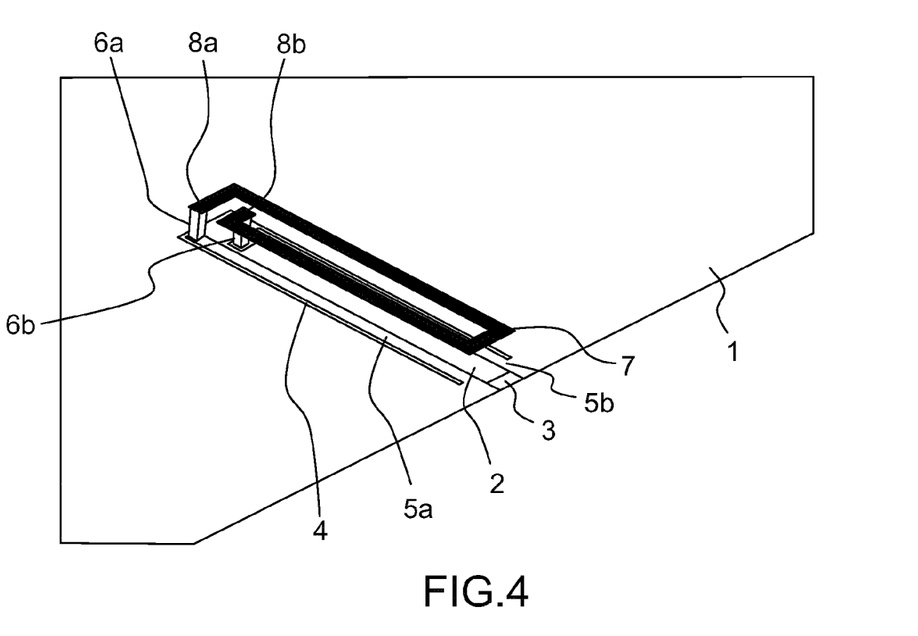
FIG. 4 shows a perspective view of an isolating slot realized according to the method of the present invention.
Figure 5:
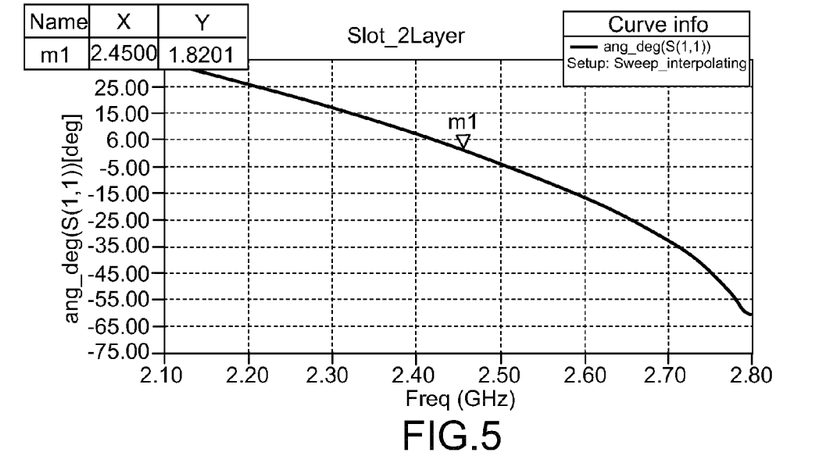
FIG. 5 is a curve giving the returned reflection phase at the input as a function of the frequency, obtained by simulating an isolating slot such as shown in FIG. 4.

The isolating slot shown in FIG. 4 enables a returned phase at the input port 3 to be obtained which is close to 0° as in the case of a short-circuited quarter-wave line, with an electrical line length approximately divided by two. This result is shown on the adaptation curve S11 of FIG. 5 for an isolating slot-line such as shown in FIG. 4. In this case, point m1 shows that the returned phase obtained by simulation is close to 0° at the central frequency of the WiFi band at 2.4 GHz. This is explained by the fact that, in the loop formed by portions 5a, 7 and 5b, the surface current around the slot-line performs a two-s circuit before coming back to the input port, thus running along an electrical length substantially equal to 180°.

In this embodiment, a slot-line with an electrical length equal to 45° was realized. On the other hand, electrical lengths L1 and L2 of the first 5a and second 5b portions of the first band are substantially identical and equal to 45° and electrical length L3 of the second band 7 is substantially equal to the sum of electrical lengths L1+L2. However, other electrical lengths less than 90° can be considered.

As shown in FIGS. 6 to 9, we compared the results obtained in the isolation of two antennae (ANT1, ANT2) realized for a MIMO circuit and isolated respectively by a standard isolating slot-line or by an isolating slot-line realized according to the method of the present invention.

Figure 6:
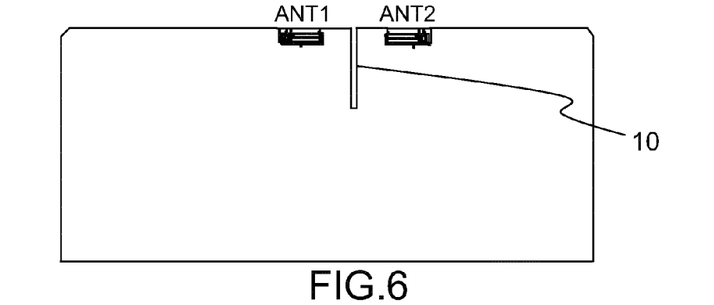
FIG. 6 is a diagrammatic top plan view of a printed circuit board featuring an isolating slot according to the prior art.

In FIG. 6, the two antennae ANT1 and ANT2 are isolated by a short-circuited slot-line 10 etched in the upper layer of a monolayer substrate between the two antennae. In this case, the length of slot-line 10 is equal to $\lambda/4$ where $\lambda$ is the wavelength at the operating frequency.

Figure 7:
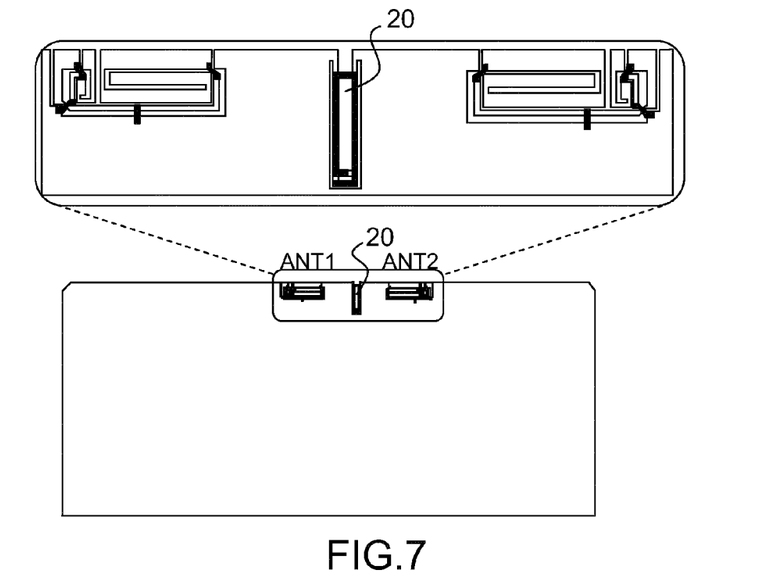
FIG. 7 is a diagrammatic top plan view of a printed circuit board and of the antenna part enlarged with an isolating slot realized according to the method of the present invention.

In FIG. 7, an isolating slot-line 20 realized according to the method of the present invention is shown, as shown in the enlarged part of FIG. 7. This slot 20 has a reduced size by comparison to slot-line 10 shown in FIG. 6.

Figure 8A:
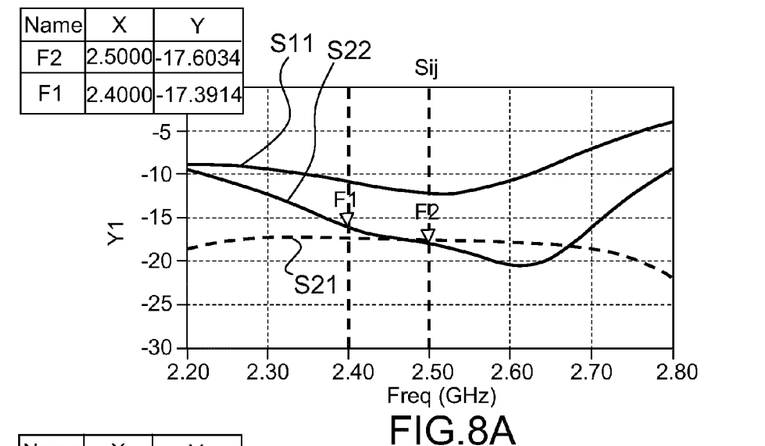
FIGS. 8A and 8B show respectively the curves for isolation and adaptation as a function of frequency, obtained by simulating an isolating slot according to the prior art of FIG. 6 or an isolating slot in accordance with the present invention of FIG. 7.
Figure 8B:
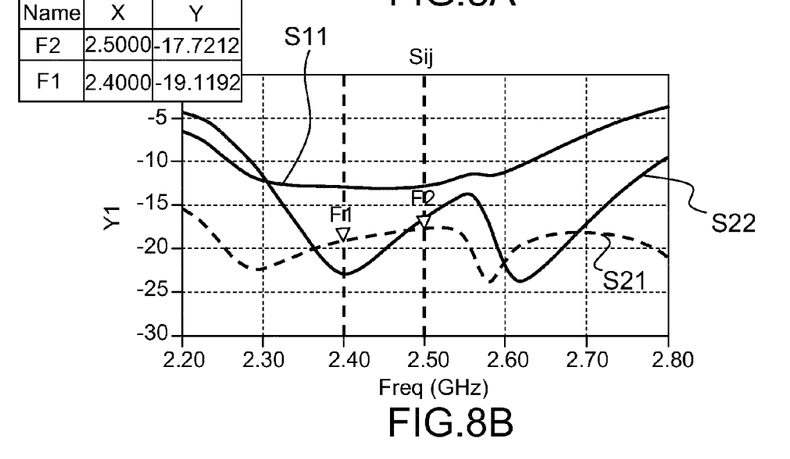
Figure 9:
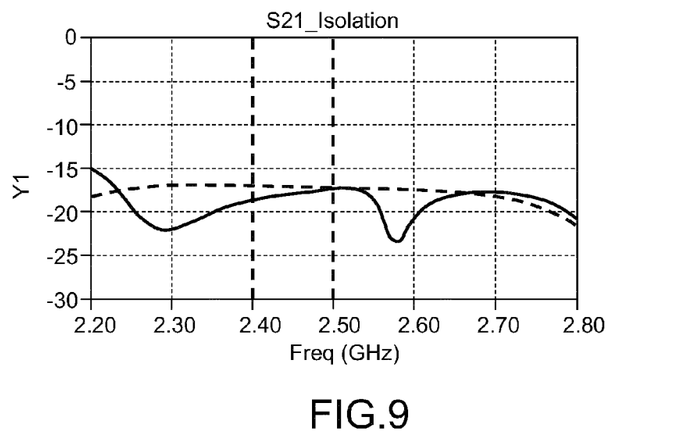
FIG. 9 gives the isolation curves between the two antennae in the case of the isolating slot of FIG. 6 and of the isolating slot of FIG. 7.

The curves in FIGS. 8A, 8B and 9 enable the comparison of the performances of the antennae in FIG. 7 with the circuit in FIG. 6. FIG. 8A shows adaptation curves S11 and S22 as well as transmission curve S21 of the circuit shown in FIG. 6 while FIG. 8B gives responses S11, S22 and S21 of the circuit shown in FIG. 7. These curves show that responses S11 and S22 of the antennae are at the same level whatever the type of isolating slot-line used and that the isolation levels obtained are around 17 dB for the two types of slot-lines. On the other hand, the curves shown in FIG. 9 give the transmission response S21 as a function of the frequency for, respectively, the circuit in FIG. 6 and the circuit in FIG. 7 validating a similar isolation level for the two types of slot-lines.

We will now describe with reference to FIGS. 10 to 13, the realization of a slot-antenna using the method in accordance with the present invention.

Figure 10:
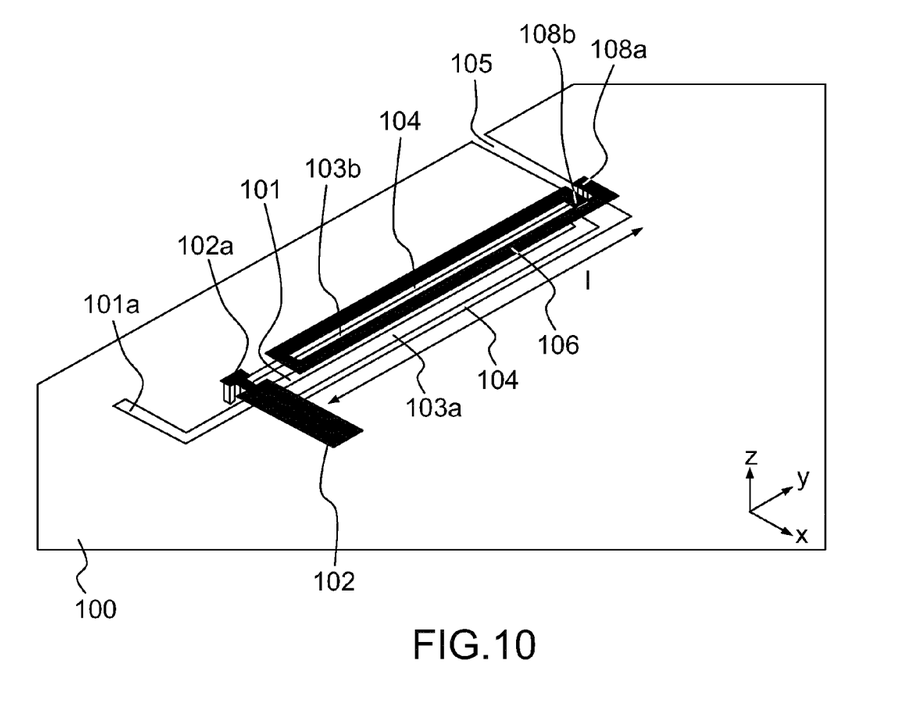
FIG. 10 is a diagrammatic perspective view of a slot-antenna realized according to the method of the present invention.

In FIG. 10 is shown in perspective a slot-antenna obtained according to the method of the present invention described above. The slot-antenna is realized on a multilayer substrate forming one part of a printed circuit board. On a first conductive layer of substrate 100, a slot-line 101 was realized which extends by a portion 101a in order to obtain the feeding of the antenna by electromagnetic coupling. In this case, as shown in FIG. 10, a portion of microstrip line 102 is realized on the opposite side of the substrate and inter-connected to the conductive layer via a metalized hole 102a. The lengths of part 102 and part 101a are determined in a known manner in order to obtain the feeding of the slot-antenna 101.

As shown in FIG. 10 and in accordance with the method of the present invention, two portions 103a and 103b of a first conductive band were realized on each side of the slot-line 101 by etching around the slot-line 101, a slot 104 of narrow width and by eliminating the short-circuit between slot 104 and slot-line 101 at the end of slot-line 101 opposite feed line 102. On the other hand, on the conductive layer opposite layer 100, a second conductive band 106 was realized forming a loop, as shown in FIG. 10. As a result, the two ends of the conductive band 106 are connected respectively to the ends of the conductive bands 103a and 103b by conductive vias 108a and 108b so as to form a current conducting loop of a total electrical length L'. On the other hand, in order to improve the operation of the antenna shown in FIG. 10, an open-circuit slot 105 is realized in the first layer 100 between the end of the slot 104 and the edge of layer 100. This slot 105 contributes to widening the operating band of the slot-antenna and to increasing its radiation efficiency.

An antenna, such as shown in FIG. 6, was simulated in order to operate in the DECT band, namely the frequency band comprised between 1880-1930 MHz. For the simulation, a board of size 230×306 mm² realized in a dielectric material known as FR4 having a thickness of 1.2 mm was used The antenna was located on one of the edges of the board. For the simulation, the physical length of the slot was chosen to be around 21 mm.

Figure 11:
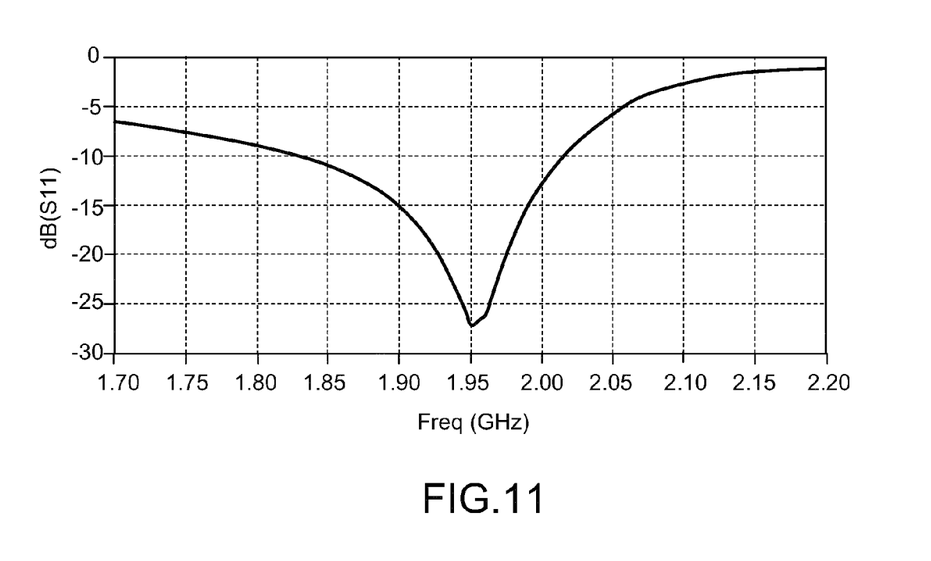
FIGS. 11, 12 and 13 are curves giving respectively, as a function of frequency, the adaptation, the yield and the gain in dB of the antenna shown in FIG. 10.
Figure 12:
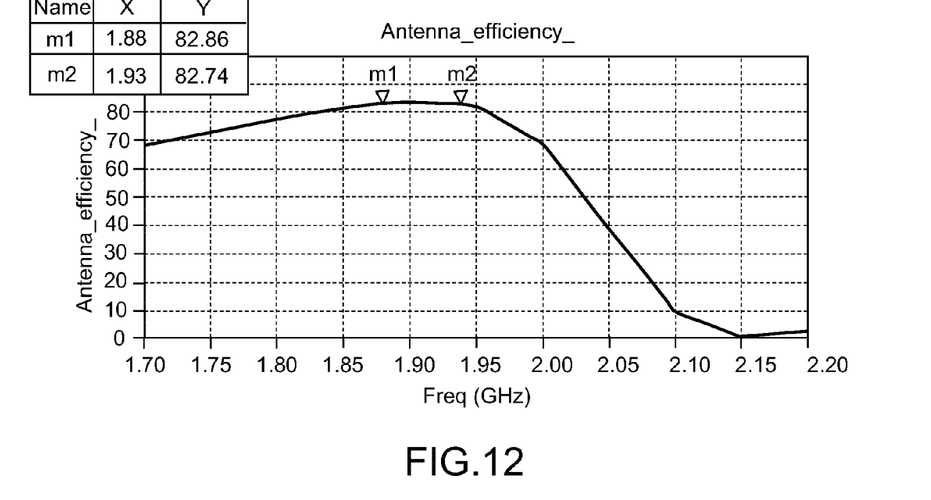
Figure 13:
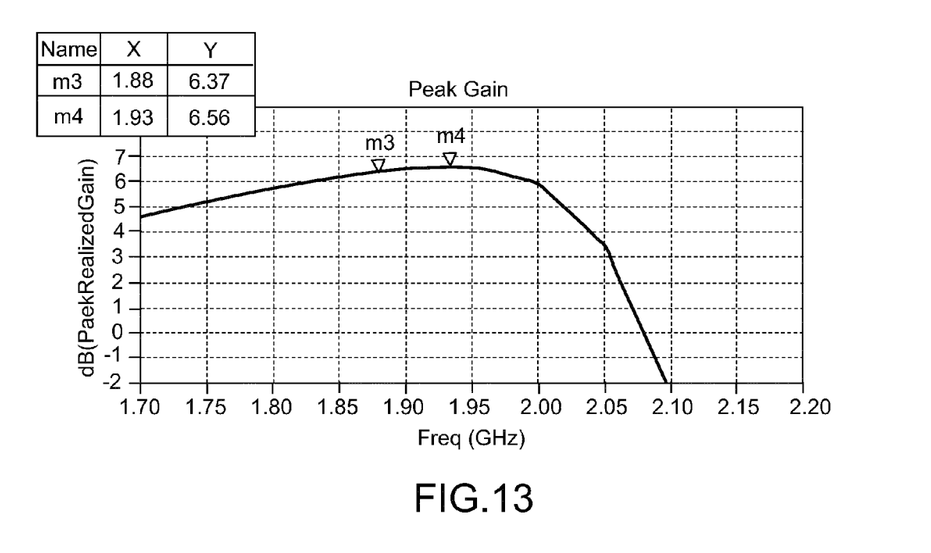

The results obtained were given by the curves in FIGS. 11 to 13 which show respectively for FIG. 11, adaptation response S11 in dB as a function of frequency, which shows a loss less than −12 dB in the DECT band.

FIG. 12 shows the yield of the antenna as a function of frequency and shows a yield greater than 80% in the DECT band.

FIG. 13 shows the peak gain in dB as a function of frequency, showing a gain greater than 6 dBi in the DECT band.

Such a structure, compared to a slot-antenna enables the surface occupied on the ground plane to be reduced by a factor of two. The space freed, as a result of the slot being folded, can be exploited for the positioning of electronic components. Its compactness enables it to be positioned more easily in the electronic board while respecting the mechanical and implementation constraints, and, moreover, while being able to provide the diversity in radiation patterns required by MIMO systems.

It is evident to those skilled in the art that the aforementioned embodiments are provided as an example.

The invention claimed is:

1. Method for realizing a slot antenna in a multilayer substrate of a printed circuit comprising at least a first conductive layer, a dielectric layer and a second conductive layer, the method comprising:
    etching in the edge of the first conductive layer a short-circuited slot-line having an electrical length L,
    etching in the first conductive layer a slot surrounding the slot-line and an opening at the short-circuited part of the slot-line so as to realize, a first portion of a first conductive band having an electrical length L1≤L and a second portion of said first conductive band having an electrical length L2≤L,
    etching in the second conductive layer, of a second conductive band in the form of a loop having an electrical length L3,
    one end of the second conductive band being connected to the first portion of the first conductive band and the other end of the second conductive band being connected to the second portion of the first conductive band so as to form a conductive loop
    wherein the sum of the electrical lengths L3+L1+L2 is substantially equal to 180°.

2. Method according to claim 1, wherein the slot-line is a line of electrical length L<90°.

3. Method according to claim 2, wherein the slot-line has an electrical length L=45°.

4. Method according to claim 1, wherein the electrical lengths L1 and L2 of the first and second portions of the first conductive band are identical.

5. Method according to claim 4, wherein the electrical lengths of the first and second portions of the first conductive band are equal to 45°.

6. Method according to claim 1, wherein the electrical length L3 of the second conductive band is substantially equal to the sum of the electrical lengths L1 and L2 of the first and second portions of the first conductive band.

7. Multilayer printed circuit comprising at least one slot-line realized according to claim 1.

8. A slot antenna, comprising
    a multilayer substrate including at least a first conductive layer, a dielectric layer and a second conductive layer:
        a short-circuited slot-line having an electrical length L, etched in the edge of the first conductive layer,
        a first portion of a first conductive band having an electrical length L1≤L and a second portion of said first conductive band having an electrical length L2≤L, etched in the first conductive layer a slot surrounding the slot-line and an opening at the short circuit part of the slot-line,
        a second conductive band in the form of a loop having an electrical length L3, etched in the second conductive layer,
        one end of the second conductive band being connected to the first portion of the first conductive band and the other end of the second conductive band being connected to the second portion of the first conductive band so as to form a conductive loop,
        wherein the sum of the electrical lengths L3+L1+L2 is substantially equal to 180°.

9. The slot antenna according to claim 8, wherein the slot-line is a line of electrical length L<90°.

10. The slot antenna according to claim 8, wherein that the slot-line has an electrical length L=45°.

11. The slot antenna according to claim 8, wherein the electrical lengths L1 and L2 of the first and second portions of the first conductive band are identical.

12. The slot antenna according to claim 8, wherein the electrical lengths of the first and second portions of the first conductive band are equal to 45°.

13. The slot antenna according to claim 8, wherein the electrical length L3 of the second conductive band is substantially equal to the sum of the electrical lengths L1 and L2 of the first and second portions of the first conductive band.

14. The slot antenna according to claim 8, wherein the slot-line is an isolating slot.

15. The slot antenna according to claim 8, wherein the slot-line extending on the side opposite the feed side by a slot-line terminating in an open circuit.

16. Terminal incorporating at least a slot antenna according to claim 8.

\* \* \* \* \*